(12) United States Patent
Narawade et al.

(10) Patent No.: US 12,294,376 B2
(45) Date of Patent: May 6, 2025

(54) DIFFERENTIAL CLOCK DUTY CYCLE CORRECTOR CIRCUITS

(71) Applicant: Open Silicon, Inc., Milpitas, CA (US)

(72) Inventors: Santosh Mahadeo Narawade, Bangalore (IN); Jithin K, Bangalore (IN); Ayan Dutta, Barasat (IN)

(73) Assignee: Alphawave Semi, Inc., Milpitas, CA (US)

( * ) Notice: Subject to any disclaimer, the term of this patent is extended or adjusted under 35 U.S.C. 154(b) by 309 days.

(21) Appl. No.: 18/091,114

(22) Filed: Dec. 29, 2022

(65) Prior Publication Data

US 2023/0216489 A1 Jul. 6, 2023

Related U.S. Application Data

(60) Provisional application No. 63/295,816, filed on Dec. 31, 2021.

(51) Int. Cl.
*H03K 5/156* (2006.01)
*H03K 3/017* (2006.01)
*H03K 5/135* (2006.01)

(52) U.S. Cl.
CPC .......... *H03K 5/1565* (2013.01); *H03K 3/017* (2013.01); *H03K 5/135* (2013.01)

(58) Field of Classification Search
None
See application file for complete search history.

(56) References Cited

U.S. PATENT DOCUMENTS

| 8,742,807 B1 * | 6/2014 | Muthali | H03L 7/00 327/146 |
| 9,602,082 B2 * | 3/2017 | Hedayati | H03K 5/1565 |
| 10,547,298 B1 * | 1/2020 | Mekky | H03K 7/08 |

(Continued)

OTHER PUBLICATIONS

A 20 GHz high speed, low jitter, high accuracy and wide correction range duty cycle corrector by Jun Guo, Peng Liu, Weidong Wang, Jicheng Chen, and Yingtao Jiang. Accessed Apr. 14, 2023; 6 pages; https://ieeexplore.ieee.org/document/7406901.

(Continued)

*Primary Examiner* — Cassandra F Cox
(74) *Attorney, Agent, or Firm* — Young Basile Hanlon & MacFarlane, P.C.

(57) ABSTRACT

Systems and methods are disclosed for differential clock duty cycle correction. For example, a method includes converting an input rail-to-rail differential clock signal to a low-swing differential signal; fixing a DC bias level of the low-swing differential signal; changing DC bias levels of ends of the low-swing differential signal in a complementary manner to change cross-over points of the low-swing differential signal; and inputting the low-swing differential signal to a level shifter and buffer to generate a duty-corrected rail-to-rail digital differential clock signal. For example, an apparatus may include a differential pair of CMOS transmission-gate switches as clock input switches; complementary differential pairs of transistors with gate terminals connected to a differential control voltage signal; and/or extra current sources for independently controlling the DC bias voltages of ends of a differential clock signal.

20 Claims, 11 Drawing Sheets

(56) References Cited

U.S. PATENT DOCUMENTS 11,309,876 B2 *  4/2022  Doppalapudi .......... H04J 3/062
2005/0122149 A1 *  6/2005  Cho ....................... H03K 5/151
                                                   327/175

OTHER PUBLICATIONS

Design of a High Frequency Duty-Cycle Corrector within 20%-80% Correction Range by Chien Yu Lin and Heng Shou Hsu; Jun. 2019; 4 pages; http://www.ijiee.org/index.php?m=content&c=index&a=show&catid=85&id=813.

* cited by examiner

DIFFERENTIAL CLOCK DUTY CYCLE CORRECTOR CIRCUITS

CROSS-REFERENCE TO RELATED APPLICATION(S)

This application claims priority to and the benefit of U.S. Provisional Patent Application Ser. No. 63/295,816, filed Dec. 31, 2021, the entire disclosure of which is hereby incorporated by reference.

TECHNICAL FIELD

This disclosure relates to differential clock duty cycle corrector circuits.

BACKGROUND

Duty cycle is a percentage or ratio of pulse duration, or pulse width to the total period of a periodic waveform, such as a clock signal. Duty cycle is generally used to represent time duration of a pulse when it is high (1) for a waveform of a given frequency. In digital electronics, signals used may be approximately rectangular waveforms. For example, a system may represent logic 1 and logic 0 by the two levels of a rectangular wave form. Duty cycle of a clock signal may become distorted in some systems and there may be a need to adjust or correct the duty cycle of a clock signal to reduce the chance of timing and sampling errors.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1:
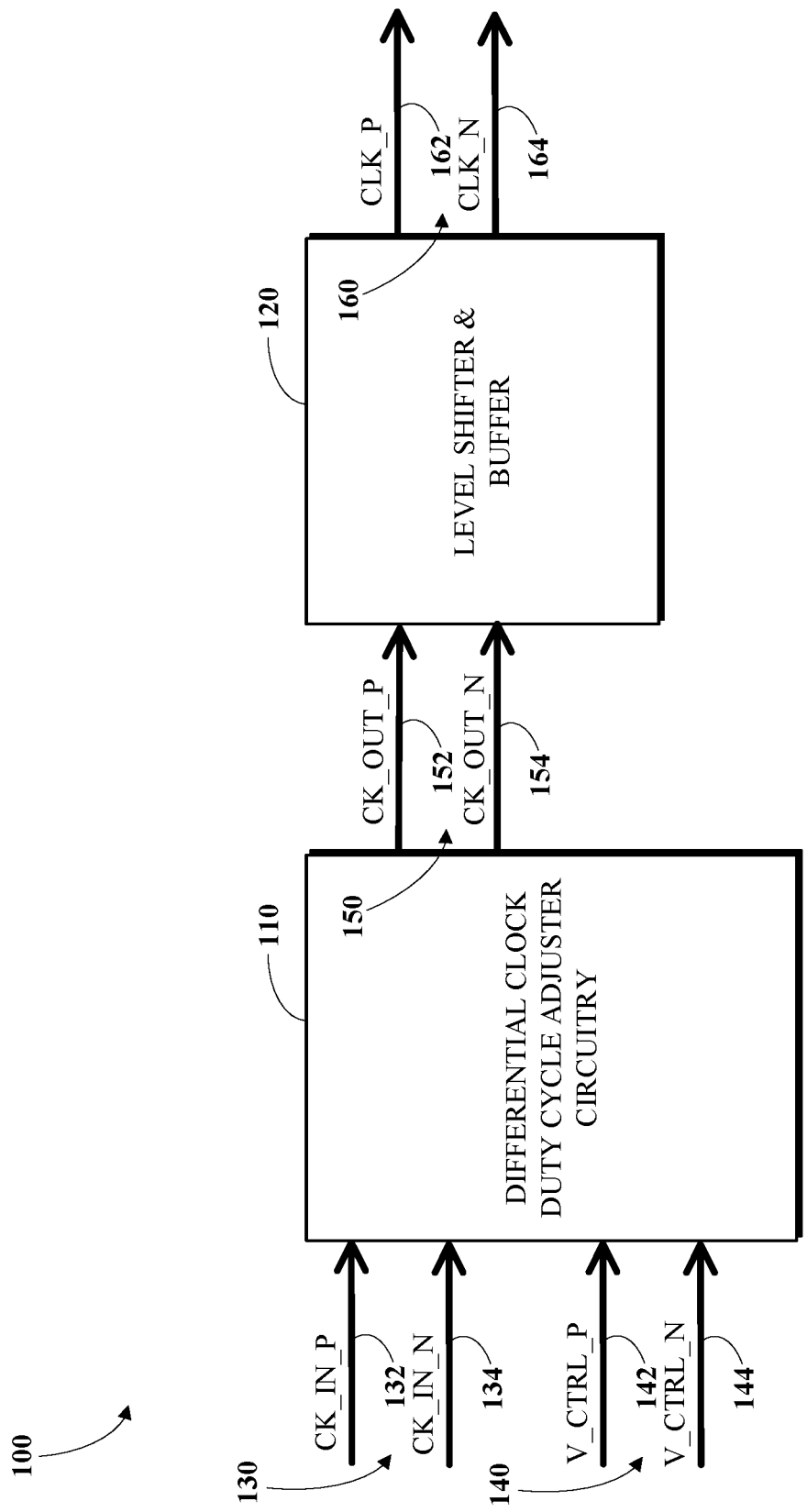
FIG. 1 is a block diagram of an example of a system for duty cycle correction of a differential clock signal.

A duty cycle adjuster takes a differential clock signal (e.g., a rail-to-rail, digital clock signal) as its input, and converts the clock signal into a low-swing differential analog signal. The duty cycle adjuster's output differential signal may be passed through a subsequent differential voltage level-shifter & buffer to convert back to a differential clock signal (e.g., a rail-to-rail, digital clock signal). The duty cycle of the resulting differential clock signal depends on the difference in the DC bias levels of the ends of the low-swing differential analog signal output by the duty cycle adjuster, which, in turn, depend on the difference between control input voltages, which may be determined based on negative feedback in a control loop to cause the resulting differential clock signal to achieve a desired duty cycle (e.g., 50% duty cycle). The control input voltages to the duty cycle adjuster may be low-swing differential analog signals. When a differential voltage is applied to the control input nodes of the duty cycle adjuster, the direct current (DC) bias levels of the low-swing differential analog signal output by the duty cycle adjuster change differentially. These changes in the DC bias levels essentially change the cross-over points of the low-swing differential analog signal output by the duty cycle adjuster. This change in cross-over points of the low-swing differential analog signal results in the duty-cycle correction of the resulting differential clock signal output from the differential voltage level-shifter & buffer.

Some duty cycle adjusters may have the following three limitations. First, the theoretical lower limit of its base delay is dictated by the response time of an input differential NMOS pair, the input differential clock signal is applied to the gate terminals of the input differential NMOS pair. The signal-inversion done by the input differential NMOS pair contributes to the base delay of the duty cycle adjuster. Second, the DC bias level of the low-swing differential analog signal output by the duty cycle adjuster cannot be independently controlled without affecting the gain of the duty cycle adjuster and the voltage swing of the low-swing differential analog signal output by the duty cycle adjuster. A gain of the duty cycle adjuster is defined as: (differential change in duty-cycle of output signals)/(differential change in control input voltages). In order for the subsequent level-shifter & buffer stage to work flawlessly across manufacturing process, voltage & temperature (PVT), the ends of the low-swing differential analog signal output by the duty cycle adjuster must have proper DC bias level & proper voltage swing. Third, a differential pair of transistors (e.g., an NMOS differential pair) in a duty cycle adjuster are supposed to work properly only when the control input voltages applied to their gate terminals stay above a certain lower limit, which may be dictated by the overdrive voltage of a tail current source and a minimum allowable gate-source voltage (Vgs) of differential pair of transistors. Even for systems designed to keep the control input voltages above this lower limit across PVT, these control input voltages may go down below the acceptable lower limit in some samples due to inter-die and intra-die mismatch/variation.

A proposed duty cycle adjuster architecture may utilize some combination of three features. First, converting an input rail-to-rail differential clock signal to a low-swing differential signal. Second, fixing a DC bias level of the low-swing differential signal. Third, changing the DC bias levels of the low-swing differential signal in a complementary manner, so that the cross-over points of this differential signal change, which, in turn, results in the duty cycle correction of a resulting output clock signal.

This approach may solve or mitigate some of the problems of conventional duty cycle adjuster architectures. For example, an input NMOS pair of a conventional duty cycle adjuster may be replaced with a differential pair of CMOS transmission-gate switches. In some implementations, a tail current from a current source (e.g., a PMOS tail current) is differentially pumped into the level-shifter & buffer stage, which be modeled by a resistance and capacitance in parallel corresponding the input gate capacitance of the level-shifter & buffer stage. For example, the response time of a current—switching mechanism using CMOS transmission-gate may be much less than that of a conventional differential MOSFET pair, thus the base delay of a duty cycle adjuster using a CMOS transmission gate may be improved as compared with the conventional duty cycle adjuster architectures.

Giving the ends of the low-swing differential analog signal a proper DC bias level and controlling the gain of the duty cycle adjuster may be easier in the proposed duty cycle adjuster architecture, compared with conventional duty cycle adjusters. For example, by explicitly pumping the currents into the output loads (i.e., the inputs to a level-shifter & buffer stage), the DC bias levels of the ends of the low-swing differential analog signal output by the duty cycle adjuster may be independently controlled. Controlling the DC bias levels may be independent of the duty-correction mechanism.

In order to solve or mitigate the problem of a differential pair of transistors (e.g., an NMOS differential pair) not responding to low values of control input voltages, an additional complementary pair of transistors (e.g., a PMOS differential pair) may be added to the duty cycle adjuster. When control input voltages are low, the complementary pair of transistors is expected to respond, while for higher control input voltages values, the conventional differential pair of transistors will respond. For voltages somewhere in the middle range between supply & ground, both differential pairs of transistors (e.g., a PMOS differential pair and an NMOS differential pair) will work fine.

Some implementations may provide advantages over conventional systems for duty cycle adjustment, such as, for example, providing a lower base delay; providing finer independent controllability of an output differential signal, including control of the DC bias level and the peak-to-peak amplitude of the output differential signal; enabling differential change in DC Bias levels of ends of a low-swing differential signal output from a duty cycle adjuster for a duty cycle correction mechanism; and robust duty cycle correction across many samples, even in the presence of inter-die & intra-die variation of device performance due to addition of a complementary transistor pair driven by control input voltages.

As used herein, the phrase "current source" refers to an electronic circuit or component thereof that is configured to deliver or absorb an electric current independent of an electric voltage applied to it. A "current source" may be configured as a "current sink" when connected to a negative voltage supply or ground. Further, as used herein, the term "circuitry" refers to an arrangement of electronic components (e.g., transistors, resistors, capacitors, and/or inductors) that is structured to implement one or more functions. For example, a circuitry may include one or more transistors interconnected to form logic gates that collectively implement a logical function.

FIG. 1 is a block diagram of an example of a system 100 for duty cycle correction of a differential clock signal. The system 100 includes a differential clock duty cycle adjuster circuitry 110 and a level shifter and buffer 120. The differential clock duty cycle adjuster circuitry 110 takes a differential clock signal 130 as input. For example, the differential clock signal 130 may be a rail-to-rail digital clock signal with a duty cycle that has deviated from a desired duty cycle (e.g., 70% duty cycle instead of a desired 50% duty cycle). The differential clock signal 130 is applied between a first clock input node 132 and a second clock input node 134. The differential clock duty cycle adjuster circuitry 110 also takes a differential control input voltage 140 as input. The differential control input voltage 140 is applied between a first control signal node 142 and a second control signal node 144. Although not shown in FIG. 1, the differential clock duty cycle adjuster circuitry 110 may also take one or more bias voltages as input. The differential clock duty cycle adjuster circuitry 110 converts the differential clock signal 130 to a low-swing differential signal 150 (e.g., a low-swing analog differential clock signal) that is generated between a first output node 152 and a second output node 154.

The level shifter and buffer 120 has input nodes connected to the first output node 152 and the second output node 154. The low-swing differential signal 150 is input to the level shifter and buffer 120 to generate a duty-corrected rail-to-rail digital differential clock signal 160 between a first clock output node 162 and a second clock output node 164. The DC bias levels of the ends of the low-swing differential signal 150 may be changed differentially based on the differential control input voltage 140 to change the cross-over points of the low-swing differential signal 150. Changing these cross-over points in turn changes the duty cycle of the duty-corrected rail-to-rail digital differential clock signal 160 that is output from the level shifter and buffer 120. For example, the differential clock duty cycle adjuster circuitry 110 may include the differential clock duty cycle adjuster circuitry 300 of FIG. 3. For example, the differential clock duty cycle adjuster circuitry 110 may include the differential clock duty cycle adjuster circuitry 400 of FIG. 4. For example, the differential clock duty cycle adjuster circuitry 110 may include the differential clock duty cycle adjuster circuitry 500 of FIG. 5. For example, the differential clock duty cycle adjuster circuitry 110 may include the differential clock duty cycle adjuster circuitry 600 of FIG. 6. For example, the differential clock duty cycle adjuster circuitry 110 may include the differential clock duty cycle adjuster circuitry 700 of FIG. 7. For example, the differential clock duty cycle adjuster circuitry 110 may include the differential clock duty cycle adjuster circuitry 800 of FIG. 8. For example, the system 100 may be used to implement the process 900 of FIG. 9.

The system 100 for duty cycle correction may be able to correct a wide range of duty cycles for input (e.g., in the range 30-70%) due to adjustment in DC bias. In some implementations, the system 100 is able to correct low-swing differential input signals and does not require full-swing differential input. Some implementations of the system 100 may have low base delay due in part to rail-to-rail to low-swing output conversion for control loop feedback and converting back to full-swing for output of the duty-corrected differential clock signal. In some implementations, setup of independent DC bias for ends of the low-swing differential clock signal can reduce settling time for a control loop for duty cycle correction. For example, using a rail-to-rail control circuit may enable the system 100 to be used for duty cycle correction over a wide frequency range for clock signals, such as, a range from 500 MHz to 2 GHz.

Figure 2:
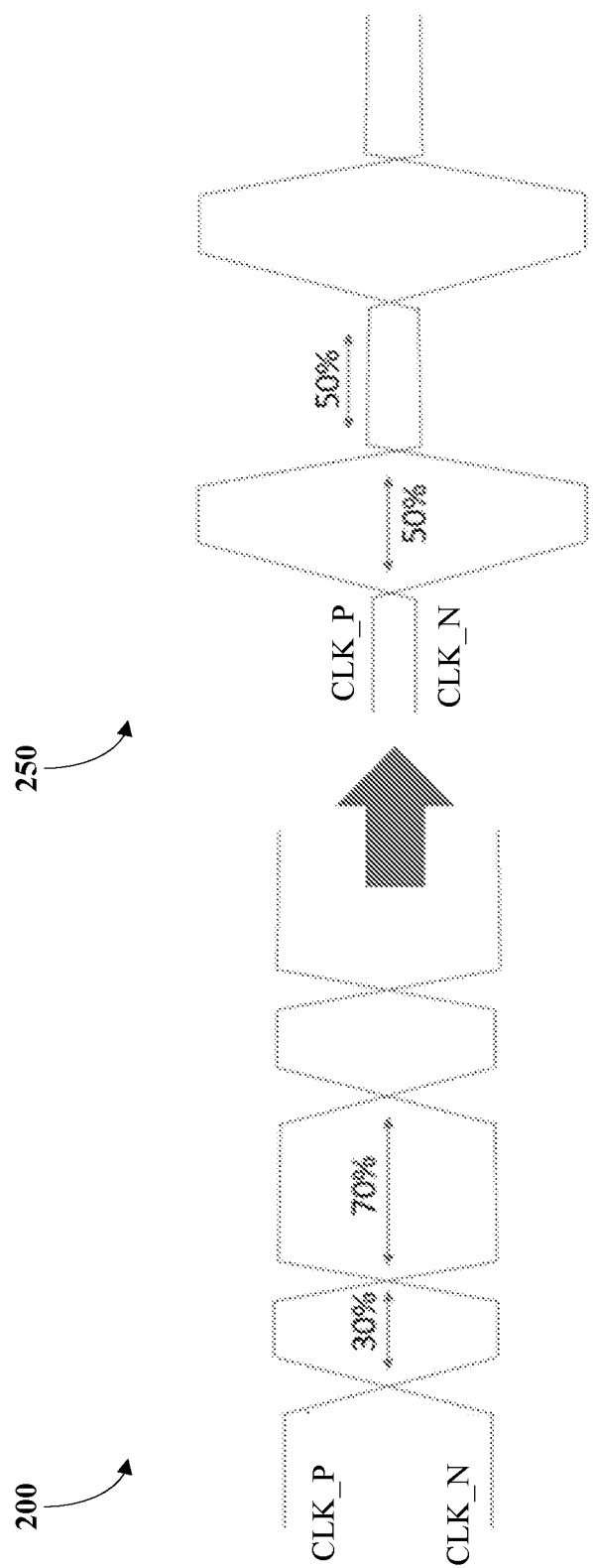
FIG. 2 is an illustration of duty cycle correction of a differential clock signal.

FIG. 2 is an illustration of duty cycle correction of a differential clock signal. Waveform plot 200, on the left, illustrates an example of a low-swing analog differential clock signal (e.g., the low-swing differential signal 150) at the output of the differential clock duty cycle adjuster circuitry 110 in the absence of negative feedback control loop operation. The low-swing analog differential clock signal of waveform plot 200 has cross-over points corresponding to a duty cycle of 70%, which matches the duty cycle of an input differential clock signal that it was converted from. The waveform plot 200 shows the two ends, CLK_P and CLK_N, of the low-swing analog differential clock signal varying in a complementary fashion. The right side of FIG. 2 shows a waveform plot 250 of an example of a low-swing analog differential clock signal (e.g., the low-swing differential signal 150) at the output of the differential clock duty cycle adjuster circuitry 110 in the presence of negative feedback control loop operation (e.g., an active differential control input voltage 140). The low-swing analog differential clock signal of waveform plot 250 has cross-over points corresponding to a duty cycle of 50% after changes in the DC bias levels of the ends, CLK_P and CLK_N.

Figure 3:
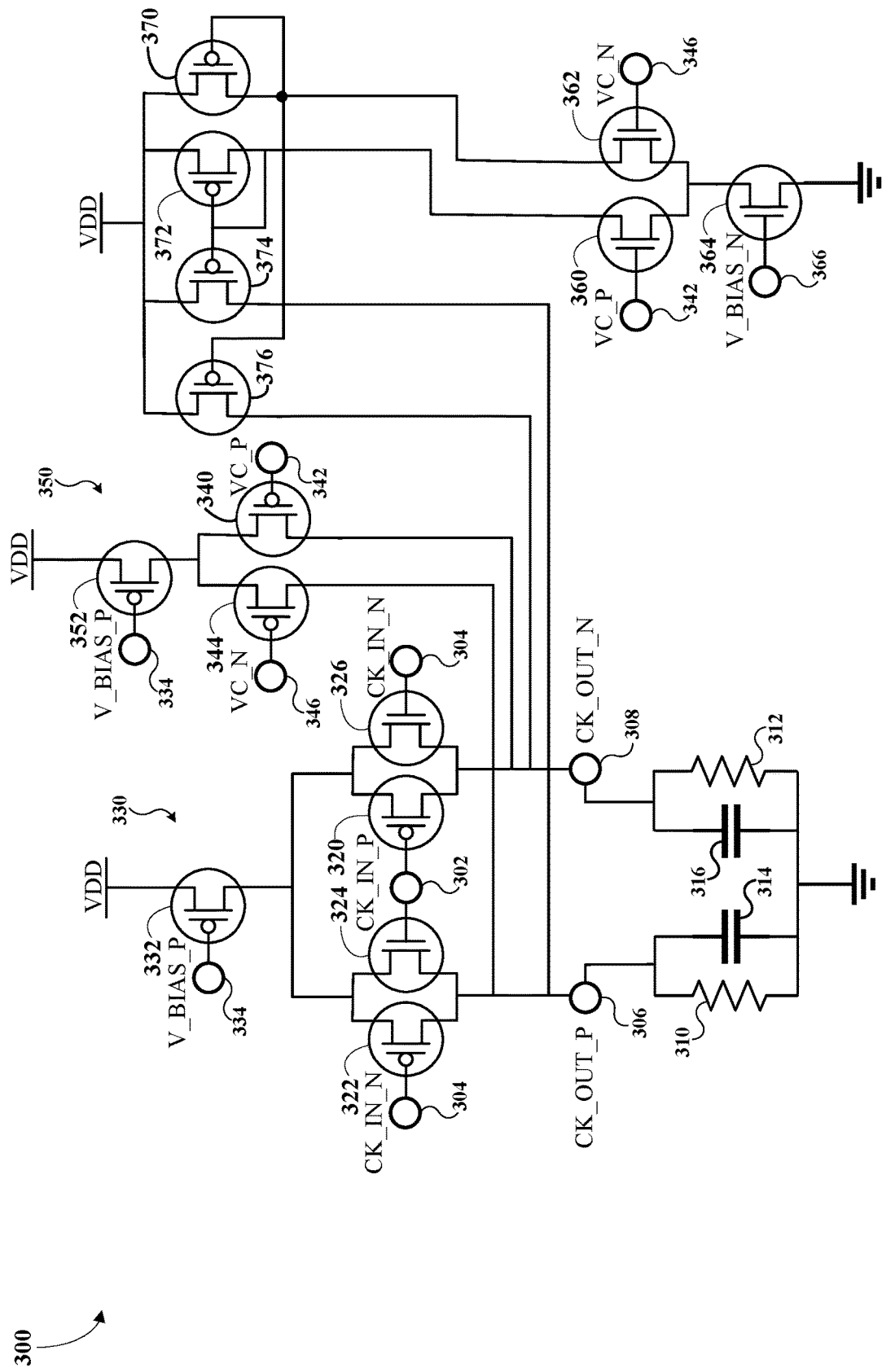
FIG. 3 is a circuit diagram of an example of a differential clock duty cycle adjuster circuitry.

FIG. 3 is a circuit diagram of an example of a differential clock duty cycle adjuster circuitry 300. The differential clock duty cycle adjuster circuitry 300 is connected between a first input node 302, a second input node 304, a first output node 306, and a second output node 308. For example, a differential clock signal (e.g., the differential clock signal 130) may be applied between the first input node 302 and the second input node 304. For example, a differential clock signal (e.g., the low-swing differential signal 150) may be output between the first output node 306 and the second output node 308. In some implementations, a rail-to-rail digital differential clock signal is applied to the first input node 302 and the second input node 304 and a low-swing analog differential clock signal is generated at the first output node 306 and the second output node 308.

The first output node 306 is connected to a load, which is modeled in FIG. 3 as resistance 310 in parallel with a capacitance 314. For example, the load may be an input impedance of gate terminal in the level shifter and buffer 120. Similarly, the second output node 308 is connected to a load modeled as a resistance 312 in parallel with a capacitance 316. In some implementations, the differential clock duty cycle adjuster circuitry 300 is connected to a level shifter and buffer with input nodes connected to the first output node 306 and the second output node 308. For example, a low-swing analog differential clock signal at the first output node 306 and the second output node 308 may be input to the level shifter and buffer to generate a duty-corrected rail-to-rail digital differential clock signal.

The differential clock duty cycle adjuster circuitry 300 includes a first PMOS transistor 320 with a gate terminal connected to the first input node 302, a source terminal connected to a first current source 330, and a drain terminal connected to the second output node 308; a second PMOS transistor 322 with a gate terminal connected to the second input node 304, a source terminal connected to the first current source 330, and a drain terminal connected to the first output node 306; a first NMOS transistor 324 with a gate terminal connected to the first input node 302, a drain terminal connected to the first current source 330, and a source terminal connected to the first output node 306; and a second NMOS transistor 326 with a gate terminal connected to the second input node 304, a drain terminal connected to the first current source 330, and a source terminal connected to the second output node 308. The first current source 330 includes a PMOS transistor 332 with a gate terminal connected to a bias voltage node 334. A bias voltage applied to the bias voltage node 334 may control a current output from the first current source 330. The transistors 320, 322, 324, and 326 may form a differential pair of CMOS transmission-gate switches. In some implementations, a tail current from the first current source 330 is differentially pumped into the level-shifter & buffer stage. For example, the response time of a current—switching mechanism using CMOS transmission-gate may be much less than that of a conventional differential MOSFET pair, thus the base delay of the differential clock duty cycle adjuster circuitry 300 may be improved as compared with the conventional duty cycle adjuster architectures.

The differential clock duty cycle adjuster circuitry 300 includes a third PMOS transistor 340 with a gate terminal connected to a first differential control signal node 342, a source terminal connected to a second current source 350, and a drain terminal connected to the second output node 308; and a fourth PMOS transistor 344 with a gate terminal connected to a second differential control signal node 346, a source terminal connected to the second current source 350, and a drain terminal connected to the first output node 306. The second current source 350 includes a PMOS transistor 352 with a gate terminal connected to a bias voltage node 334. The second current source 350 includes a PMOS transistor 352 with a gate terminal connected to a bias voltage node 334. A bias voltage applied to the bias voltage node 334 may control a current output from the second current source 350. A differential control input voltage (e.g., the differential control input voltage 140) may be applied between the first differential control signal node 342 and the second differential control signal node 346. For example, the differential control input voltage may be determined based on negative feedback control loop operation to use the differential clock duty cycle adjuster circuitry 300 to achieve a desired duty cycle (e.g., 50%) for an output differential clock signal. The voltages at the first differential control signal node 342 and the second differential control signal node 346 may vary in a complementary manner.

The differential clock duty cycle adjuster circuitry 300 includes a NMOS transistor 360 with a gate terminal connected to the first differential control signal node 342; a NMOS transistor 362 with a gate terminal connected to the second differential control signal node 346 and a source terminal connected to a source terminal of the NMOS transistor 360; a NMOS transistor 364 with a gate terminal connected to a bias voltage input node 366, a drain terminal connected to the source terminal of the NMOS transistor 360 and the source terminal of the NMOS transistor 362, and a source terminal connected to a ground node; a PMOS transistor 370 with a gate terminal connected to its own drain terminal, which is connected to a drain terminal of the NMOS transistor 362, and a source terminal connected to a voltage supply node (VDD); a PMOS transistor 372 with a gate terminal connected to its own drain terminal, which is connected to a drain terminal of the NMOS transistor 360, and a source terminal connected to a voltage supply node (VDD); a PMOS transistor 374 with a gate terminal connected to the gate terminal of the PMOS transistor 372, a source terminal connected to a voltage supply node (VDD), and a drain terminal connected to the first output node 306; and a PMOS transistor 376 with a gate terminal connected to the gate terminal of the PMOS transistor 370, a source terminal connected to a voltage supply node (VDD), and a drain terminal connected to the second output node 308.

The PMOS differential pair of PMOS transistor 340 and PMOS transistor 344 may serve to solve or mitigate the problem of a differential pair of transistors (e.g., the NMOS differential pair 360 and 362) not responding to low values of control input voltages. When control input voltages (i.e., at nodes 342 or 346) are low, the PMOS transistor 340 and PMOS transistor 344 may be expected to respond, while for higher control input voltages values, the NMOS transistor 360 and NMOS transistor 362 will respond. For voltages somewhere in the middle range between supply & ground, both differential pairs of transistors (e.g., a PMOS differential pair and an NMOS differential pair) will work fine.

Figure 4:
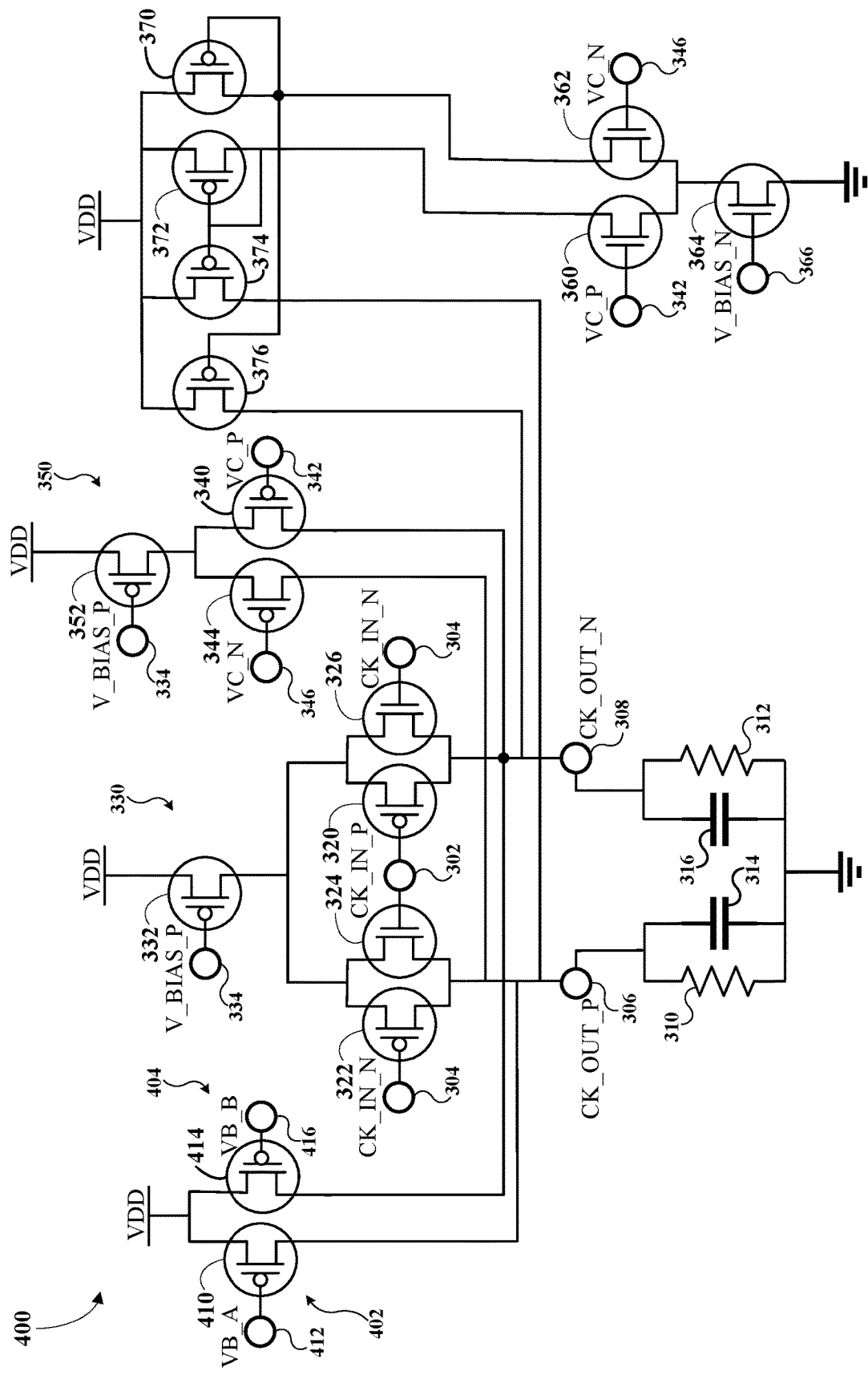
FIG. 4 is a circuit diagram of an example of a differential clock duty cycle adjuster circuitry.

FIG. 4 is a circuit diagram of an example of a differential clock duty cycle adjuster circuitry 400. The differential clock duty cycle adjuster circuitry 400 has all the components of the differential clock duty cycle adjuster circuitry 300 plus an additional pair of current sources (402 and 404) configured to control DC bias levels of the ends of the differential output signal at the first output node 306 and the second output node 308.

The differential clock duty cycle adjuster circuitry 400 includes a third current source 402 connected to the first output node 306; and a fourth current source 404 connected to the second output node 308. The third current source 402 includes a PMOS transistor 410 with a gate terminal connected to a bias voltage node 412. A bias voltage applied to the bias voltage node 412 may control a current output from the third current source 402. The fourth current source 404 includes a PMOS transistor 414 with a gate terminal connected to a bias voltage node 416. A bias voltage applied to the bias voltage node 416 may control a current output from the fourth current source 404. In some implementations, the bias voltage node 412 and the bias voltage node 416 are connected and a single bias voltage controls the currents from both the third current source 402 and the fourth current source 404. For example, the third current source 402 may include a PMOS transistor 410 with a gate terminal connected to a bias voltage node 412 and the fourth current source 404 includes a PMOS transistor 414 with a gate terminal connected to the bias voltage node 412. In some implementations, the third current source 402 and the fourth current source 404 are independently controlled using separate bias control pins connected to the respective bias control input nodes. For example, the third current source 402 may include a PMOS transistor 410 with a gate terminal coupled to a first bias control pin and the fourth current source 404 may include a PMOS transistor 414 with a gate terminal connected to a second bias control pin to enable independent bias control of voltages at the first output node 306 and the second output node 308.

The third current source 402 and the fourth current source 404 may serve to independently control the DC bias levels of the ends of the low-swing differential analog signal output by the differential clock duty cycle adjuster circuitry 400. Control of the DC bias levels may be independent of the duty-correction mechanism that is controlled by a differential control input signal applied at the first differential control signal node 342 and the second differential control signal node 346. For example, setup of independent DC bias can reduce settling time for a control loop for duty cycle correction.

Figure 5:
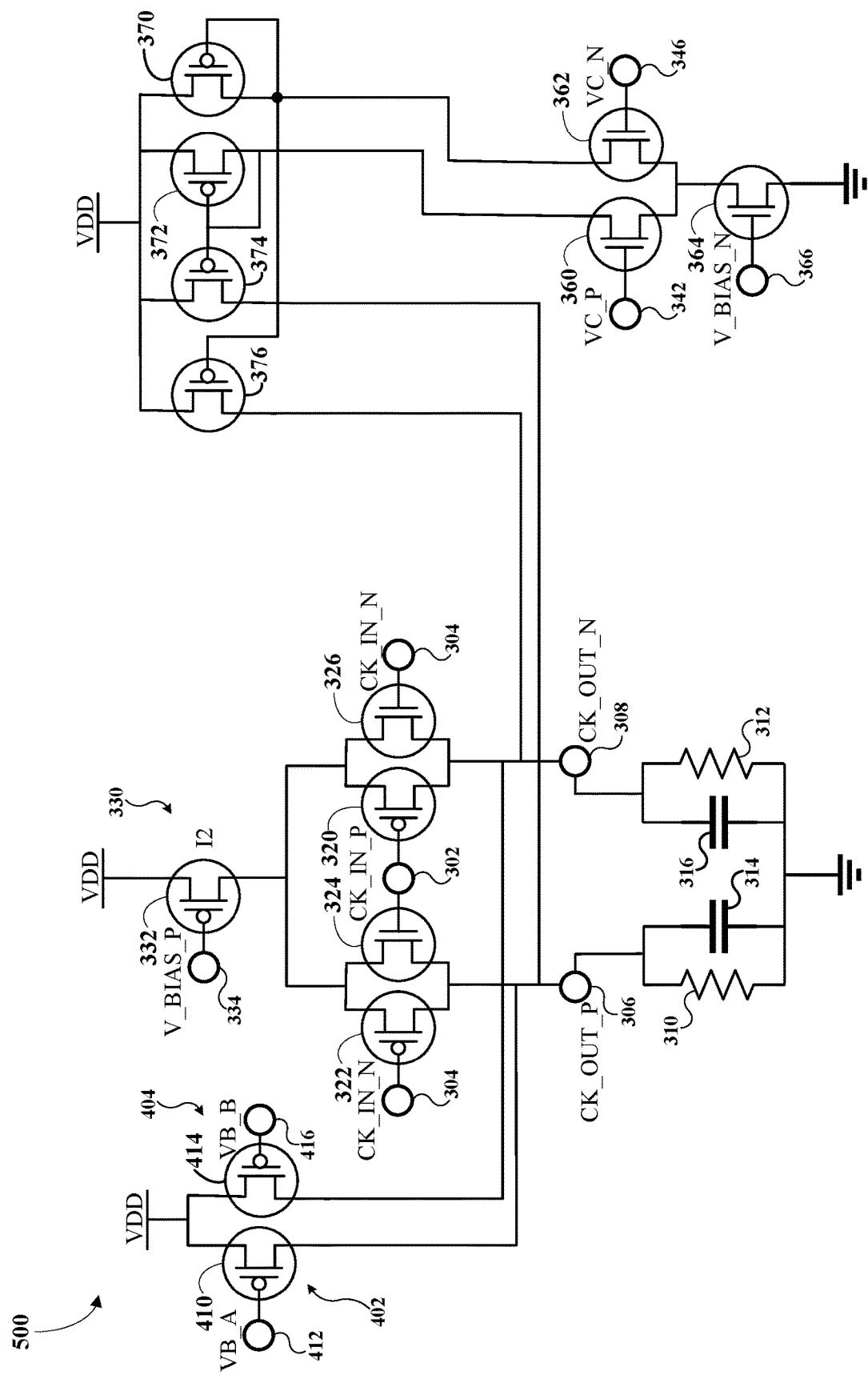
FIG. 5 is a circuit diagram of an example of a differential clock duty cycle adjuster circuitry.

FIG. 5 is a circuit diagram of an example of a differential clock duty cycle adjuster circuitry 500. The differential clock duty cycle adjuster circuitry 500 has a different combination of features from the differential clock duty cycle adjuster circuitry 400. The differential clock duty cycle adjuster circuitry 500 includes most of the components of the differential clock duty cycle adjuster circuitry 400, but omits the third PMOS transistor 340, the fourth PMOS transistor 344, and the second current source 350. Thus, the differential clock duty cycle adjuster circuitry 500 may provide the advantages of low base delay and independent DC bias control for the ends of the low-swing differential signal at the output nodes 306 and 308, but may be susceptible to poor duty cycle correction performance when a control input signal is low.

Figure 6:
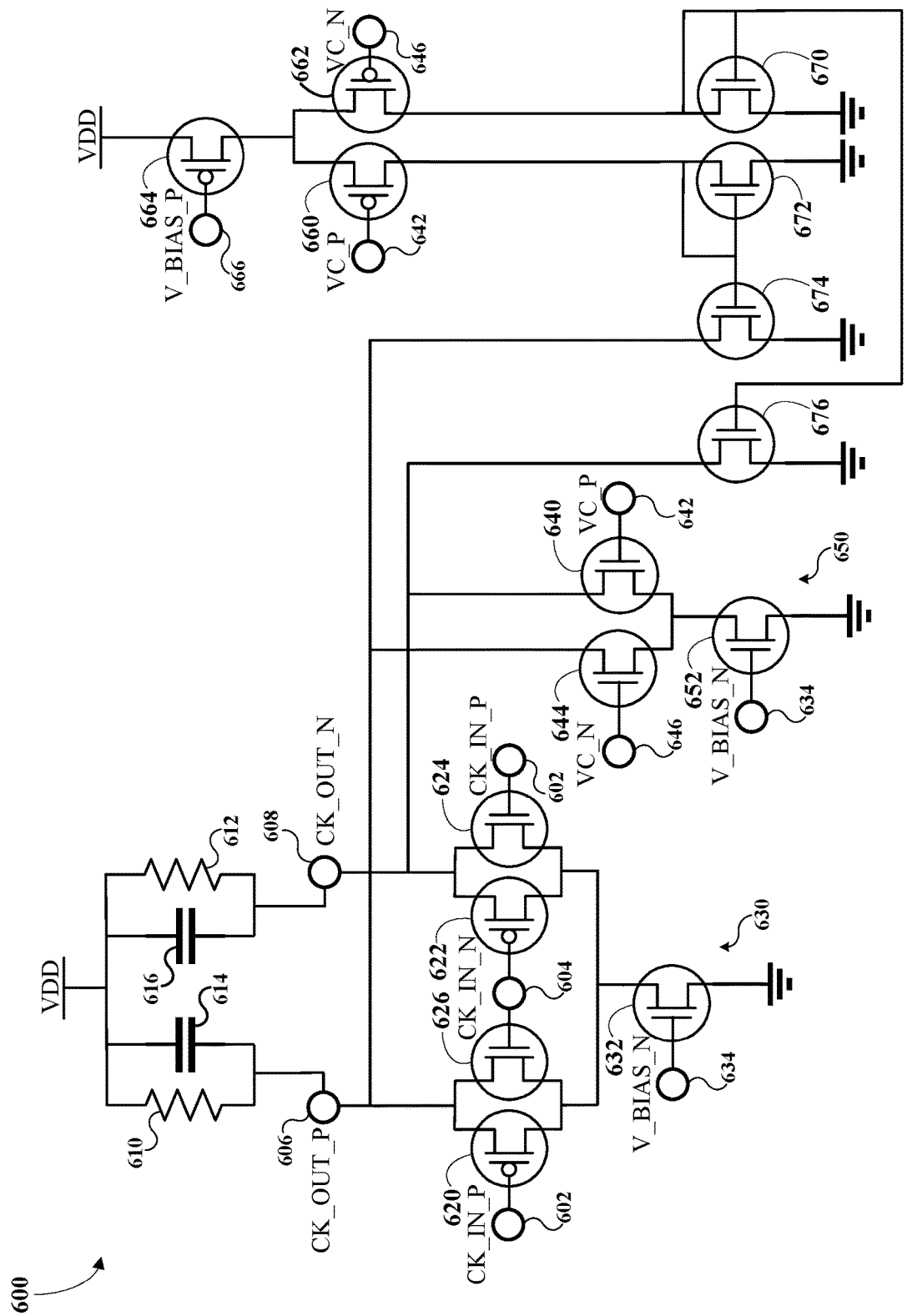
FIG. 6 is a circuit diagram of an example of a differential clock duty cycle adjuster circuitry.

FIG. 6 is a circuit diagram of an example of a differential clock duty cycle adjuster circuitry 600. The differential clock duty cycle adjuster circuitry 600 is connected between a first input node 602, a second input node 604, a first output node 606, and a second output node 608. For example, a differential clock signal (e.g., the differential clock signal 130) may be applied between the first input node 602 and the second input node 604. For example, a differential clock signal (e.g., the low-swing differential signal 150) may be output between the first output node 606 and the second output node 608. In some implementations, a rail-to-rail digital differential clock signal is applied to the first input node 602 and the second input node 604 and a low-swing analog differential clock signal is generated at the first output node 606 and the second output node 608.

The first output node 606 is connected to a load, which is modeled in FIG. 6 as resistance 610 in parallel with a capacitance 614. For example, the load may be an input impedance of gate terminal in the level shifter and buffer 120. Similarly, the second output node 608 is connected to a load modeled as a resistance 612 in parallel with a capacitance 616. In some implementations, the differential clock duty cycle adjuster circuitry 600 is connected to a level shifter and buffer with input nodes connected to the first output node 606 and the second output node 608. For example, a low-swing analog differential clock signal at the first output node 606 and the second output node 608 may be input to the level shifter and buffer to generate a duty-corrected rail-to-rail digital differential clock signal.

The differential clock duty cycle adjuster circuitry 600 includes a first PMOS transistor 620 with a gate terminal connected to the first input node 602, a drain terminal connected to a first current sink 630, and a source terminal connected to the first output node 606; a second PMOS transistor 622 with a gate terminal connected to the second input node 604, a drain terminal connected to the first current sink 630, and a source terminal connected to the second output node 608; a first NMOS transistor 624 with a gate terminal connected to the first input node 602, a source terminal connected to the first current sink 630, and a drain terminal connected to the second output node 608; and a second NMOS transistor 626 with a gate terminal connected to the second input node 604, a source terminal connected to the first current sink 630, and a drain terminal connected to the first output node 606. The first current sink 630 includes a NMOS transistor 632 with a gate terminal connected to a bias voltage node 634. A bias voltage applied to the bias voltage node 634 may control a current drawn by the first current sink 630. The transistors 620, 622, 624, and 626 may form a differential pair of CMOS transmission-gate switches. In some implementations, a head current through the first current sink 630 is differentially drawn from the level-shifter & buffer stage. For example, the response time of a current—switching mechanism using CMOS transmission-gate may be much less than that of a conventional differential MOSFET pair, thus the base delay of the differential clock duty cycle adjuster circuitry 600 may be improved as compared with the conventional duty cycle adjuster architectures.

The differential clock duty cycle adjuster circuitry 600 includes a third NMOS transistor 640 with a gate terminal connected to a first differential control signal node 642, a source terminal connected to a second current sink 650, and a drain terminal connected to the second output node 608;

and a fourth NMOS transistor 644 with a gate terminal connected to a second differential control signal node 646, a source terminal connected to the second current sink 650, and a drain terminal connected to the first output node 606. The second current sink 650 includes a NMOS transistor 652 with a gate terminal connected to a bias voltage node 634. A bias voltage applied to the bias voltage node 634 may control a current drawn by the second current sink 650. A differential control input voltage (e.g., the differential control input voltage 140) may be applied between the first differential control signal node 642 and the second differential control signal node 646. For example, the differential control input voltage may be determined based on negative feedback control loop operation to use the differential clock duty cycle adjuster circuitry 600 to achieve a desired duty cycle (e.g., 50%) for an output differential clock signal. The voltages at the first differential control signal node 642 and the second differential control signal node 646 may vary in a complementary manner.

The differential clock duty cycle adjuster circuitry 600 includes a PMOS transistor 660 with a gate terminal connected to the first differential control signal node 642; a PMOS transistor 662 with a gate terminal connected to the second differential control signal node 646 and a source terminal connected to a source terminal of the PMOS transistor 660; a PMOS transistor 664 with a gate terminal connected to a bias voltage input node 666, a drain terminal connected to the source terminal of the PMOS transistor 660 and the source terminal of the PMOS transistor 662, and a source terminal connected to voltage supply node (VDD); a NMOS transistor 670 with a gate terminal connected to its own drain terminal, which is connected to a drain terminal of the PMOS transistor 662, and a source terminal connected to a ground node; a NMOS transistor 672 with a gate terminal connected to its own drain terminal, which is connected to a drain terminal of the PMOS transistor 660, and a source terminal connected to a ground node; a NMOS transistor 674 with a gate terminal connected to the gate terminal of the NMOS transistor 672, a source terminal connected to a ground node, and a drain terminal connected to the first output node 606; and a NMOS transistor 676 with a gate terminal connected to the gate terminal of the NMOS transistor 670, a source terminal connected to a ground node, and a drain terminal connected to the second output node 608.

The NMOS differential pair of NMOS transistor 640 and NMOS transistor 644 may serve to solve or mitigate the problem of a differential pair of transistors (e.g., the PMOS differential pair 660 and 662) not responding to high values of control input voltages. When control input voltages (i.e., at nodes 642 or 646) are low, the PMOS transistor 660 and the PMOS transistor 662 may be expected to respond, while for higher control input voltages values, the NMOS transistor 640 and the NMOS transistor 644 will respond. For voltages somewhere in the middle range between supply & ground, both differential pairs of transistors (e.g., a PMOS differential pair and an NMOS differential pair) will work fine.

Figure 7:
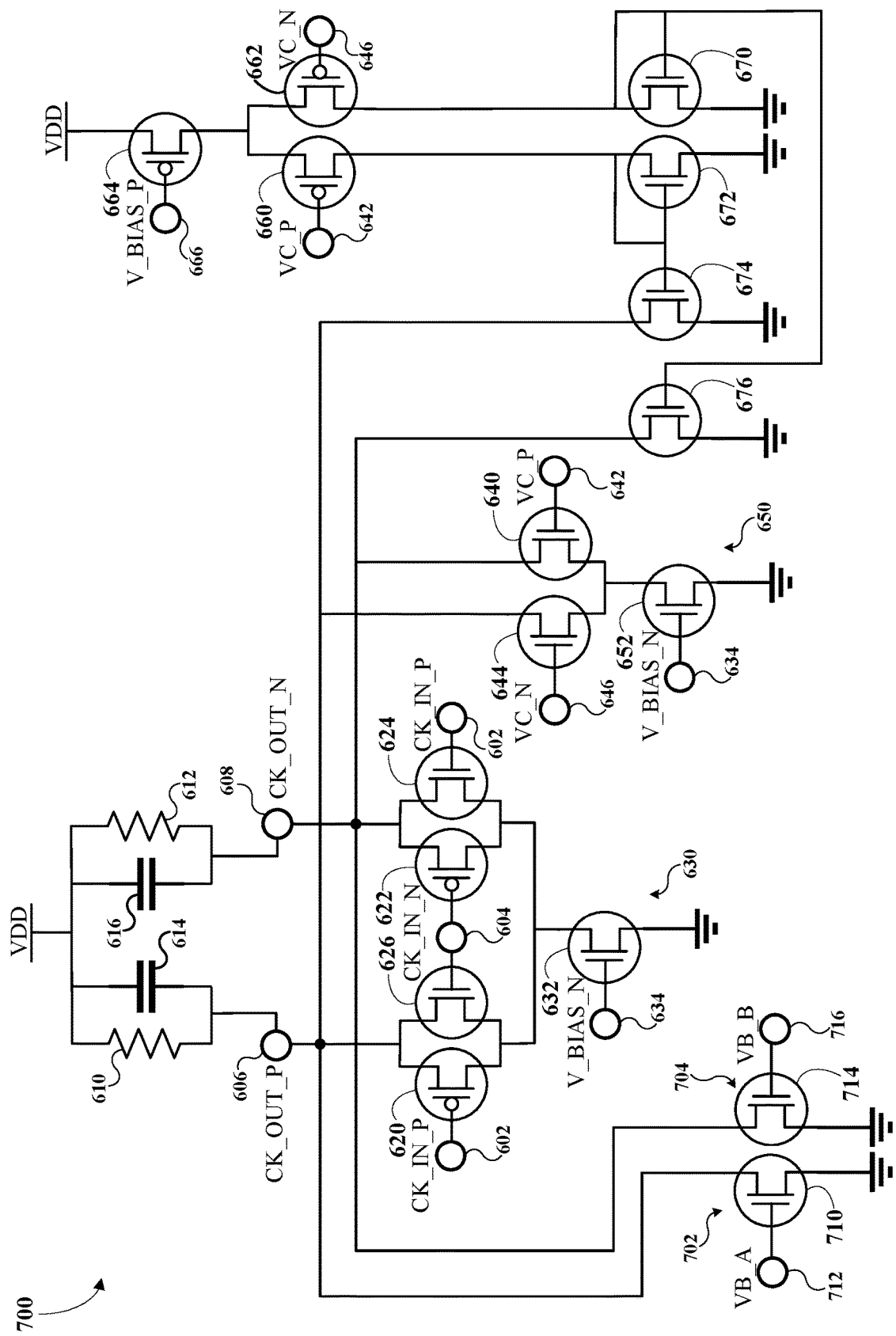
FIG. 7 is a circuit diagram of an example of a differential clock duty cycle adjuster circuitry.

FIG. 7 is a circuit diagram of an example of a differential clock duty cycle adjuster circuitry 700. The differential clock duty cycle adjuster circuitry 700 has all the components of the differential clock duty cycle adjuster circuitry 600 plus an additional pair of current sinks (702 and 704) configured to control DC bias levels of the ends of the differential output signal at the first output node 606 and the second output node 608.

The differential clock duty cycle adjuster circuitry 700 includes a third current sink 702 connected to the first output node 606; and a fourth current sink 704 connected to the second output node 608. The third current sink 702 includes a NMOS transistor 710 with a gate terminal connected to a bias voltage node 712. A bias voltage applied to the bias voltage node 712 may control a current drawn by the third current sink 702. The fourth current sink 704 includes a NMOS transistor 714 with a gate terminal connected to a bias voltage node 716. A bias voltage applied to the bias voltage node 716 may control a current drawn by the fourth current sink 704. In some implementations, the bias voltage node 712 and the bias voltage node 716 are connected and a single bias voltage controls the currents to both the third current sink 702 and the fourth current sink 704. For example, the third current sink 702 may include a NMOS transistor 710 with a gate terminal connected to a bias voltage node 712 and the fourth current sink 704 includes a NMOS transistor 714 with a gate terminal connected to the bias voltage node 712. In some implementations, the third current sink 702 and the fourth current sink 704 are independently controlled using separate bias control pins connected to the respective bias control input nodes. For example, the third current sink 702 may include a NMOS transistor 710 with a gate terminal coupled to a first bias control pin and the fourth current sink 704 includes a NMOS transistor 714 with a gate terminal connected to a second bias control pin to enable independent bias control of voltages at the first output node 606 and the second output node 608.

The third current sink 702 and the fourth current sink 704 may serve to independently control the DC bias levels of the ends of the low-swing differential analog signal output by the differential clock duty cycle adjuster circuitry 700. Control of the DC bias levels may be independent of the duty-correction mechanism that is controlled by a differential control input signal applied at the first differential control signal node 642 and the second differential control signal node 646. For example, setup of independent DC bias may reduce settling time for a control loop for duty cycle correction.

Figure 8:
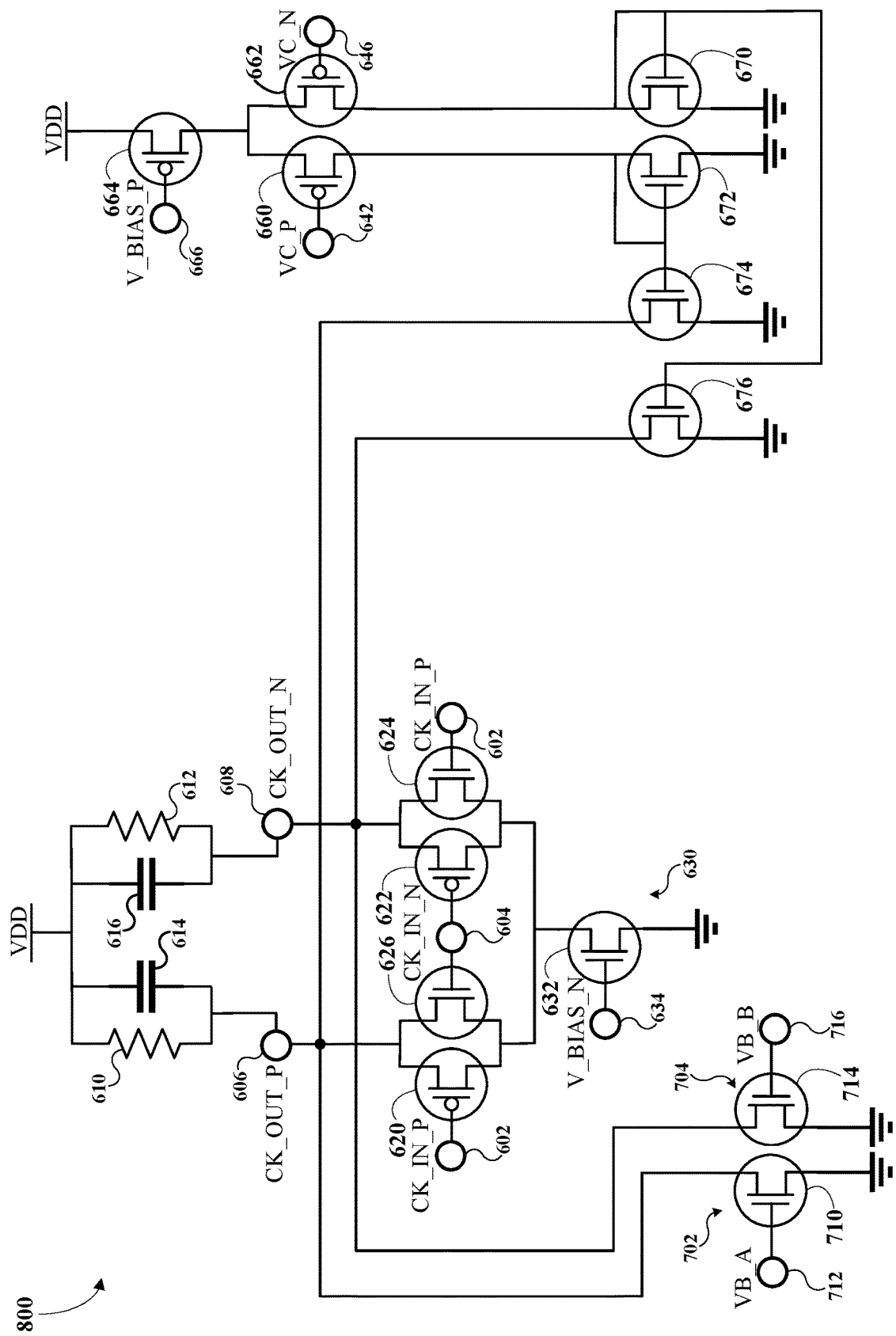
FIG. 8 is a circuit diagram of an example of a differential clock duty cycle adjuster circuitry.

FIG. 8 is a circuit diagram of an example of a differential clock duty cycle adjuster circuitry 800. The differential clock duty cycle adjuster circuitry 800 has a different combination of features from the differential clock duty cycle adjuster circuitry 700. The differential clock duty cycle adjuster circuitry 800 includes most of the components of the differential clock duty cycle adjuster circuitry 700, but omits the third NMOS transistor 640, the fourth NMOS transistor 644, and the second current sink 650. Thus, the differential clock duty cycle adjuster circuitry 800 may provide the advantages of low base delay and independent DC bias control for the ends of the low-swing differential signal at the output nodes 606 and 608, but may be susceptible to poor duty cycle correction performance when a control input signal is high.

Figure 9:
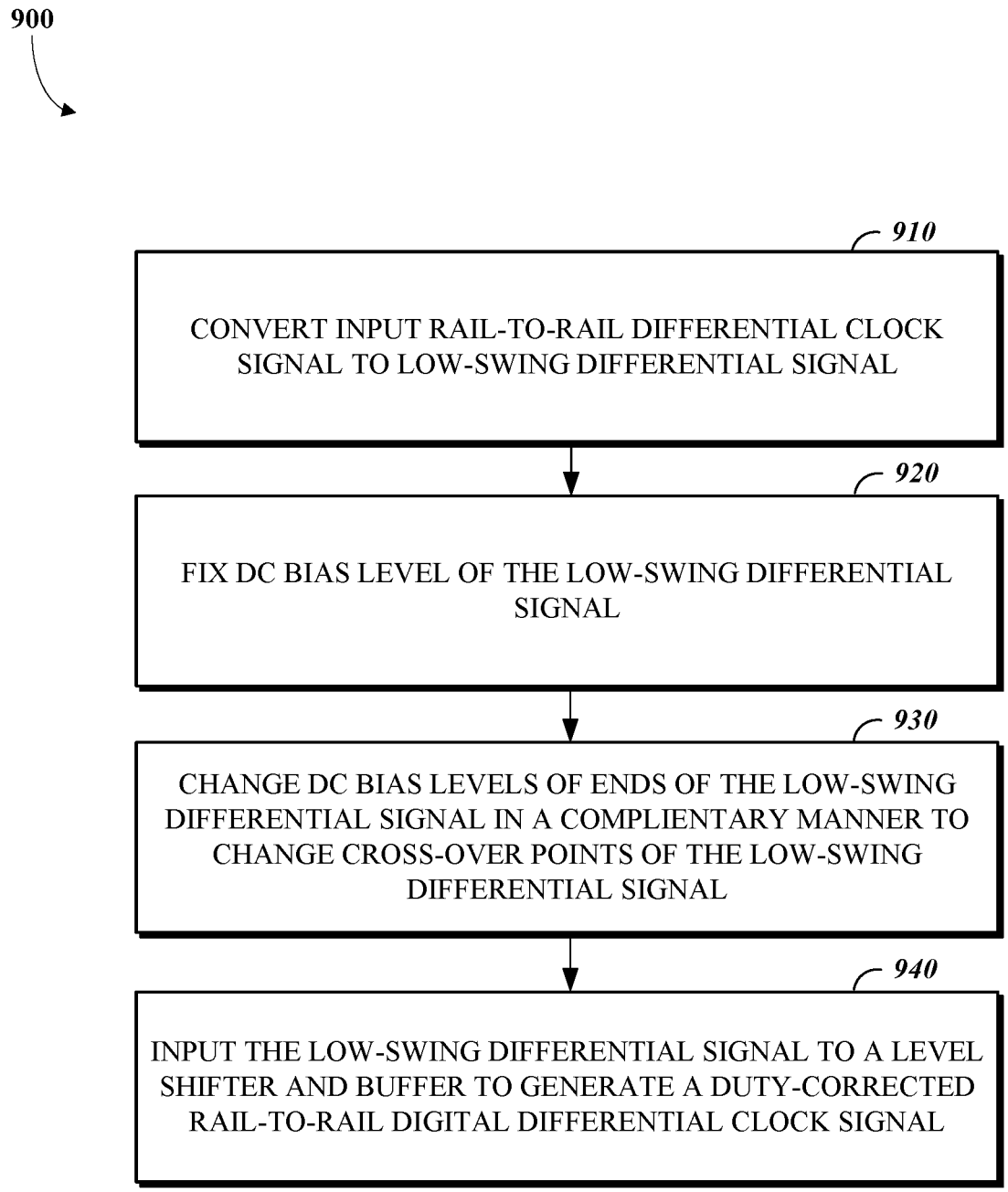
FIG. 9 a flow chart of an example of a process for duty cycle correction of a differential clock signal.

FIG. 9 a flow chart of an example of a process 900 for duty cycle correction of a differential clock signal. The process 900 includes converting 910 an input rail-to-rail differential clock signal to a low-swing differential signal; fixing 920 a DC bias level of the low-swing differential signal; changing 930 DC bias levels of ends of the low-swing differential signal in a complementary manner to change cross-over points of the low-swing differential signal; and inputting 940 the low-swing differential signal to a level shifter and buffer to generate a duty-corrected rail-to-rail digital differential clock signal. The process 900 may provide advantages over conventional methods for duty cycle correction, such as, for example, expanding a range recoverable duty cycles at the input (e.g., being able to recover from 70% duty cycle or from an 80% duty cycle), independently controlling DC bias levels for two ends of a differential clock signal, and/or increasing the gain of a duty cycle adjuster. For example, the system 100 of FIG. 1 may be used to implement the process 900.

The process 900 includes converting 910 an input rail-to-rail differential clock signal to a low-swing differential signal. For example, a differential pair of CMOS transmission gate switches (e.g., the transistors 320, 322, 324, and 326 or the transistors 620, 622, 624, and 626) may be used to convert 910 an input rail-to-rail differential clock signal to a low-swing differential signal (e.g., a low-swing analog differential clock signal).

The process 900 includes fixing 920 a DC bias level of the low-swing differential signal. For example, fixing 920 a DC bias level of the low-swing differential signal may include determining a bias input voltage for a current source in a differential clock duty cycle adjuster circuitry.

The process 900 includes changing 930 DC bias levels of ends of the low-swing differential signal (e.g., the low-swing differential signal 150) in a complementary manner to change cross-over points of the low-swing differential signal. For example, complementary differential pairs (e.g., an NMOS differential pair and a PMOS differential pair) of transistors with gate terminals connected to a differential control voltage signal may be used change 930 the DC bias levels. This approach may make the process 900 robust to a wider range control voltage level.

In some implementations, the DC bias levels of the low-swing differential signal are controlled independently of duty cycle correction of the input rail-to-rail differential clock signal. For example, the third current source 402 and the fourth current source 404 may be used to independently control the DC bias levels of the ends of the low-swing differential signal. In some implementations, the process 900 includes driving voltages on a first bias control pin and a second bias control pin to independently control DC bias levels of voltages at a first output node and a second output node that bear the low-swing differential signal.

The process 900 includes inputting 940 the low-swing differential signal to a level shifter and buffer (e.g., the level shifter and buffer 120) to generate a duty-corrected rail-to-rail digital differential clock signal. The process 900 may be used to achieve high precision duty cycle correction over a wide range of input duty cycles. In some implementations, the input rail-to-rail differential clock signal has a duty cycle between 60 percent and 70 percent, and the duty-corrected rail-to-rail digital differential clock signal has a duty cycle between 48 percent and 52 percent.

Figure 10:
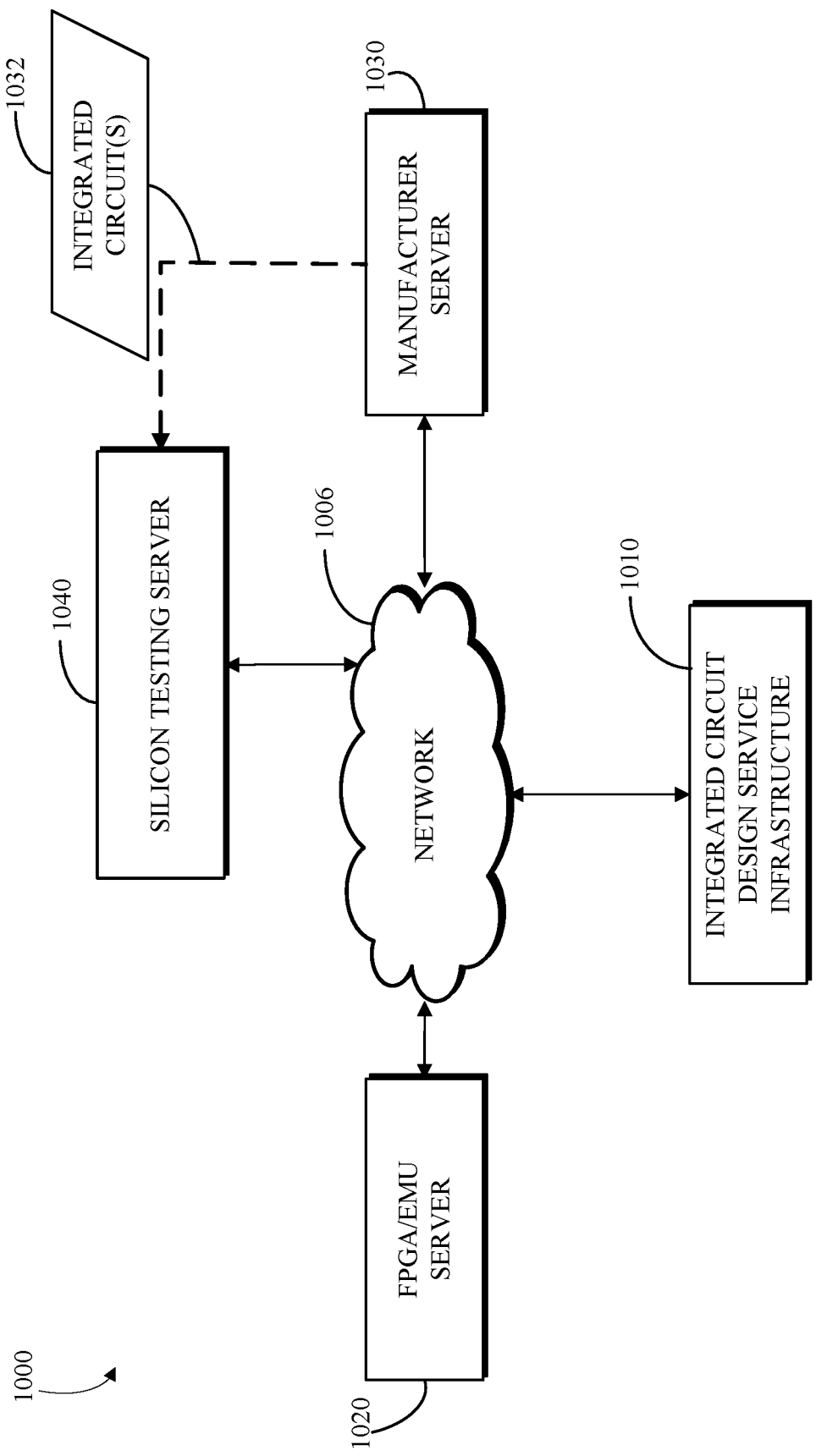
FIG. 10 is a block diagram of an example of a system for facilitating generation and manufacture of integrated circuits.

FIG. 10 is a block diagram of an example of a system 1000 for generation and manufacture of integrated circuits. The system 1000 includes a network 1006, an integrated circuit design service infrastructure 1010, a field programmable gate array (FPGA)/emulator server 1020, and a manufacturer server 1030. For example, a user may utilize a web client or a scripting API client to command the integrated circuit design service infrastructure 1010 to automatically generate an integrated circuit design based on a set of design parameter values selected by the user for one or more template integrated circuit designs. In some implementations, the integrated circuit design service infrastructure 1010 may be configured to generate an integrated circuit design that includes the circuitry shown and described in FIG. 1 and FIGS. 3-8.

The integrated circuit design service infrastructure 1010 may include a register-transfer level (RTL) service module configured to generate an RTL data structure for the integrated circuit based on a design parameters data structure. For example, the RTL service module may be implemented as Scala code. For example, the RTL service module may be implemented using Chisel. For example, the RTL service module may be implemented using flexible intermediate representation for register-transfer level (FIRRTL) and/or a FIRRTL compiler. For example, the RTL service module may be implemented using Diplomacy. For example, the RTL service module may enable a well-designed chip to be automatically developed from a high-level set of configuration settings using a mix of Diplomacy, Chisel, and FIRRTL. The RTL service module may take the design parameters data structure (e.g., a java script object notation (JSON) file) as input and output an RTL data structure (e.g., a Verilog file) for the chip.

In some implementations, the integrated circuit design service infrastructure 1010 may invoke (e.g., via network communications over the network 1006) testing of the resulting design that is performed by the FPGA/emulation server 1020 that is running one or more FPGAs or other types of hardware or software emulators. For example, the integrated circuit design service infrastructure 1010 may invoke a test using a field programmable gate array, programmed based on a field programmable gate array emulation data structure, to obtain an emulation result. The field programmable gate array may be operating on the FPGA/emulation server 1020, which may be a cloud server. Test results may be returned by the FPGA/emulation server 1020 to the integrated circuit design service infrastructure 1010 and relayed in a useful format to the user (e.g., via a web client or a scripting API client).

The integrated circuit design service infrastructure 1010 may also facilitate the manufacture of integrated circuits using the integrated circuit design in a manufacturing facility associated with the manufacturer server 1030. In some implementations, a physical design specification (e.g., a graphic data system (GDS) file, such as a GDS II file) based on a physical design data structure for the integrated circuit is transmitted to the manufacturer server 1030 to invoke manufacturing of the integrated circuit (e.g., using manufacturing equipment of the associated manufacturer). For example, the manufacturer server 1030 may host a foundry tape out website that is configured to receive physical design specifications (e.g., as a GDSII file or an OASIS file) to schedule or otherwise facilitate fabrication of integrated circuits. In some implementations, the integrated circuit design service infrastructure 1010 supports multi-tenancy to allow multiple integrated circuit designs (e.g., from one or more users) to share fixed costs of manufacturing (e.g., reticle/mask generation, and/or shuttles wafer tests). For example, the integrated circuit design service infrastructure 1010 may use a fixed package (e.g., a quasi-standardized packaging) that is defined to reduce fixed costs and facilitate sharing of reticle/mask, wafer test, and other fixed manufacturing costs. For example, the physical design specification may include one or more physical designs from one or more respective physical design data structures in order to facilitate multi-tenancy manufacturing.

In response to the transmission of the physical design specification, the manufacturer associated with the manufacturer server 1030 may fabricate and/or test integrated circuits based on the integrated circuit design. For example, the associated manufacturer (e.g., a foundry) may perform optical proximity correction (OPC) and similar post-tapeout/ pre-production processing, fabricate the integrated circuit(s) 1032, update the integrated circuit design service infrastructure 1010 (e.g., via communications with a controller or a web application server) periodically or asynchronously on the status of the manufacturing process, perform appropriate testing (e.g., wafer testing), and send to packaging house for packaging. A packaging house may receive the finished wafers or dice from the manufacturer and test materials and update the integrated circuit design service infrastructure 1010 on the status of the packaging and delivery process periodically or asynchronously. In some implementations, status updates may be relayed to the user when the user checks in using the web interface and/or the controller might email the user that updates are available.

In some implementations, the resulting integrated circuits 1032 (e.g., physical chips) are delivered (e.g., via mail) to a silicon testing service provider associated with a silicon testing server 1040. In some implementations, the resulting integrated circuits 1032 (e.g., physical chips) are installed in a system controlled by silicon testing server 1040 (e.g., a cloud server) making them quickly accessible to be run and tested remotely using network communications to control the operation of the integrated circuits 1032. For example, a login to the silicon testing server 1040 controlling a manufactured integrated circuits 1032 may be sent to the integrated circuit design service infrastructure 1010 and relayed to a user (e.g., via a web client). For example, the integrated circuit design service infrastructure 1010 may control testing of one or more integrated circuits 1032, which may be structured based on an RTL data structure.

Figure 11:
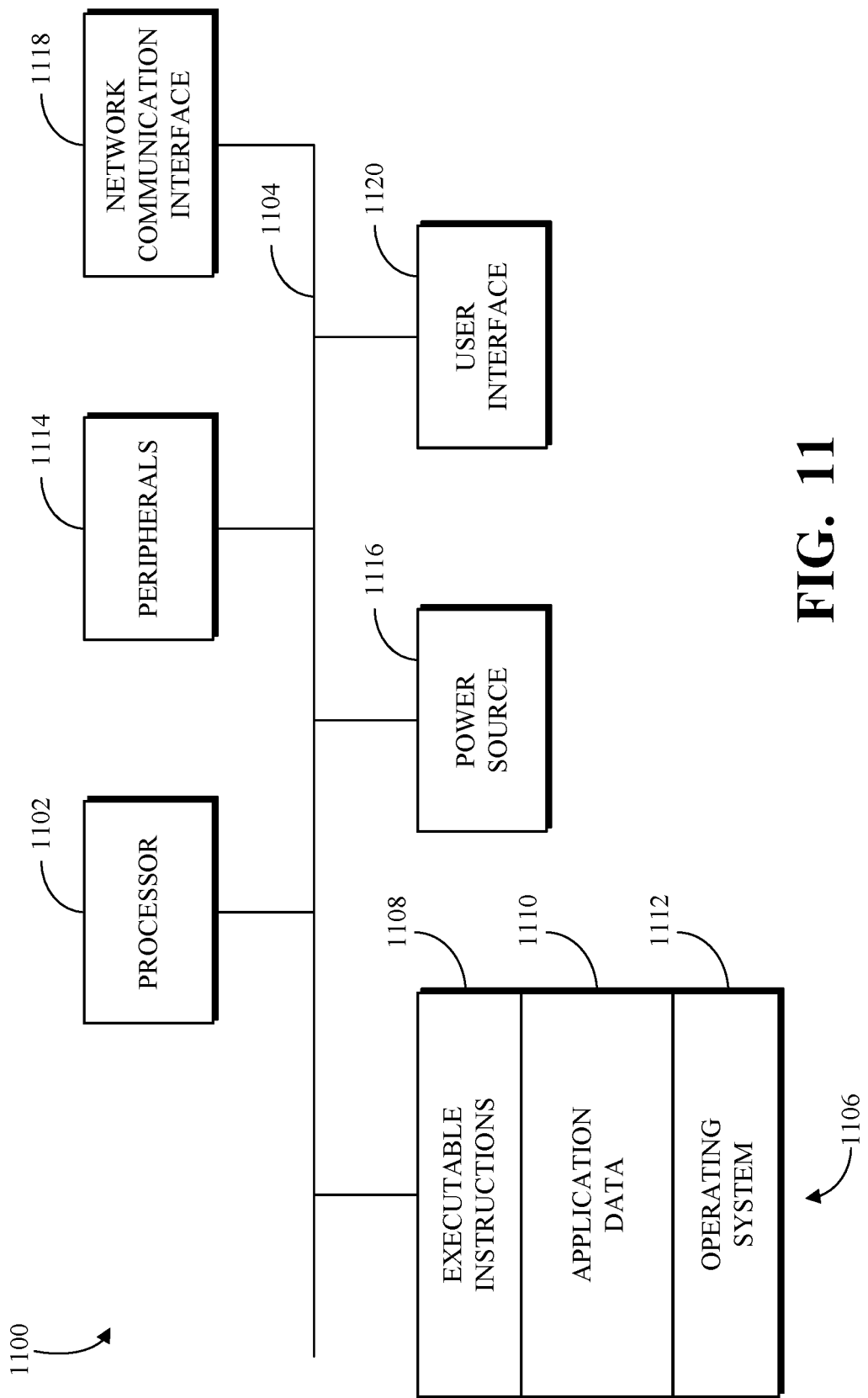
FIG. 11 is a block diagram of an example of a system for facilitating generation of integrated circuits.

FIG. 11 is a block diagram of an example of a system 1100 for facilitating generation of integrated circuits, for facilitating generation of a circuit representation for an integrated circuit, and/or for programming or manufacturing an integrated circuit. The system 1100 is an example of an internal configuration of a computing device. The system 1100 may be used to implement the integrated circuit design service infrastructure 1010, and/or to generate a file that generates a circuit representation of an integrated circuit design including the circuitry shown and described in FIG. 1 and FIGS. 3-8. The system 1100 can include components or units, such as a processor 1102, a bus 1104, a memory 1106, peripherals 1114, a power source 1116, a network communication interface 1118, a user interface 1120, other suitable components, or a combination thereof.

The processor 1102 can be a central processing unit (CPU), such as a microprocessor, and can include single or multiple processors having single or multiple processing cores. Alternatively, the processor 1102 can include another type of device, or multiple devices, now existing or hereafter developed, capable of manipulating or processing information. For example, the processor 1102 can include multiple processors interconnected in any manner, including hardwired or networked, including wirelessly networked. In some implementations, the operations of the processor 1102 can be distributed across multiple physical devices or units that can be coupled directly or across a local area or other suitable type of network. In some implementations, the processor 1102 can include a cache, or cache memory, for local storage of operating data or instructions.

The memory 1106 can include volatile memory, non-volatile memory, or a combination thereof. For example, the memory 1106 can include volatile memory, such as one or more DRAM modules such as double data rate (DDR) synchronous dynamic random access memory (SDRAM), and non-volatile memory, such as a disk drive, a solid state drive, flash memory, Phase-Change Memory (PCM), or any form of non-volatile memory capable of persistent electronic information storage, such as in the absence of an active power supply. The memory 1106 can include another type of device, or multiple devices, now existing or hereafter developed, capable of storing data or instructions for processing by the processor 1102. The processor 1102 can access or manipulate data in the memory 1106 via the bus 1104. Although shown as a single block in FIG. 11, the memory 1106 can be implemented as multiple units. For example, a system 1100 can include volatile memory, such as RAM, and persistent memory, such as a hard drive or other storage.

The memory 1106 can include executable instructions 1108, data, such as application data 1110, an operating system 1112, or a combination thereof, for immediate access by the processor 1102. The executable instructions 1108 can include, for example, one or more application programs, which can be loaded or copied, in whole or in part, from non-volatile memory to volatile memory to be executed by the processor 1102. The executable instructions 1108 can be organized into programmable modules or algorithms, functional programs, codes, code segments, or combinations thereof to perform various functions described herein. For example, the executable instructions 1108 can include instructions executable by the processor 1102 to cause the system 1100 to automatically, in response to a command, generate an integrated circuit design and associated test results based on a design parameters data structure. The application data 1110 can include, for example, user files, database catalogs or dictionaries, configuration information or functional programs, such as a web browser, a web server, a database server, or a combination thereof. The operating system 1112 can be, for example, Microsoft Windows®, macOS®, or Linux®, an operating system for a small device, such as a smartphone or tablet device; or an operating system for a large device, such as a mainframe computer. The memory 1106 can comprise one or more devices and can utilize one or more types of storage, such as solid state or magnetic storage.

The peripherals 1114 can be coupled to the processor 1102 via the bus 1104. The peripherals 1114 can be sensors or detectors, or devices containing any number of sensors or detectors, which can monitor the system 1100 itself or the environment around the system 1100. For example, a system 1100 can contain a temperature sensor for measuring temperatures of components of the system 1100, such as the processor 1102. Other sensors or detectors can be used with the system 1100, as can be contemplated. In some implementations, the power source 1116 can be a battery, and the system 1100 can operate independently of an external power distribution system. Any of the components of the system 1100, such as the peripherals 1114 or the power source 1116, can communicate with the processor 1102 via the bus 1104.

The network communication interface 1118 can also be coupled to the processor 1102 via the bus 1104. In some implementations, the network communication interface 1118 can comprise one or more transceivers. The network communication interface 1118 can, for example, provide a connection or link to a network, such as the network 1006 shown in FIG. 10, via a network interface, which can be a wired network interface, such as Ethernet, or a wireless network interface. For example, the system 1100 can communicate with other devices via the network communication interface 1118 and the network interface using one or more network protocols, such as Ethernet, transmission control protocol (TCP), Internet protocol (IP), power line communication (PLC), wireless fidelity (Wi-Fi), infrared, general packet radio service (GPRS), global system for mobile communications (GSM), code division multiple access (CDMA), or other suitable protocols.

A user interface 1120 can include a display; a positional input device, such as a mouse, touchpad, touchscreen, or the like; a keyboard; or other suitable human or machine interface devices. The user interface 1120 can be coupled to the processor 1102 via the bus 1104. Other interface devices that permit a user to program or otherwise use the system 1100 can be provided in addition to or as an alternative to a display. In some implementations, the user interface 1120 can include a display, which can be a liquid crystal display (LCD), a cathode-ray tube (CRT), a light emitting diode (LED) display (e.g., an organic light emitting diode (OLED) display), or other suitable display. In some implementations, a client or server can omit the peripherals 1114. The operations of the processor 1102 can be distributed across multiple clients or servers, which can be coupled directly or across a local area or other suitable type of network. The memory 1106 can be distributed across multiple clients or servers, such as network-based memory or memory in multiple clients or servers performing the operations of clients or servers. Although depicted here as a single bus, the bus 1104 can be composed of multiple buses, which can be connected to one another through various bridges, controllers, or adapters.

A non-transitory computer readable medium may store a circuit representation that, when processed by a computer, is used to program or manufacture an integrated circuit. For example, the circuit representation may describe the integrated circuit specified using a computer readable syntax. The computer readable syntax may specify the structure or function of the integrated circuit or a combination thereof. In some implementations, the circuit representation may take the form of a hardware description language (HDL) program, a register-transfer level (RTL) data structure, a flexible intermediate representation for register-transfer level (FIRRTL) data structure, a Graphic Design System II (GDSII) data structure, a netlist, or a combination thereof. In some implementations, the integrated circuit may take the form of a field programmable gate array (FPGA), application specific integrated circuit (ASIC), system-on-a-chip (SoC), or some combination thereof. A computer may process the circuit representation in order to program or manufacture an integrated circuit, which may include programming a field programmable gate array (FPGA) or manufacturing an application specific integrated circuit (ASIC) or a system on a chip (SoC). In some implementations, the circuit representation may comprise a file that, when processed by a computer, may generate a new description of the integrated circuit. For example, the circuit representation could be written in a language such as Chisel, an HDL embedded in Scala, a statically typed general purpose programming language that supports both object-oriented programming and functional programming.

In an example, a circuit representation may be a Chisel language program which may be executed by the computer to produce a circuit representation expressed in a FIRRTL data structure. In some implementations, a design flow of processing steps may be utilized to process the circuit representation into one or more intermediate circuit representations followed by a final circuit representation which is then used to program or manufacture an integrated circuit. In one example, a circuit representation in the form of a Chisel program may be stored on a non-transitory computer readable medium and may be processed by a computer to produce a FIRRTL circuit representation. The FIRRTL circuit representation may be processed by a computer to produce an RTL circuit representation. The RTL circuit representation may be processed by the computer to produce a netlist circuit representation. The netlist circuit representation may be processed by the computer to produce a GDSII circuit representation. The GDSII circuit representation may be processed by the computer to produce the integrated circuit.

In another example, a circuit representation in the form of Verilog or VHDL may be stored on a non-transitory computer readable medium and may be processed by a computer to produce an RTL circuit representation. The RTL circuit representation may be processed by the computer to produce a netlist circuit representation. The netlist circuit representation may be processed by the computer to produce a GDSII circuit representation. The GDSII circuit representation may be processed by the computer to produce the integrated circuit. The foregoing steps may be executed by the same computer, different computers, or some combination thereof, depending on the implementation.

In a first aspect, the subject matter described in this specification can be embodied in an apparatus that includes a differential clock duty cycle adjuster circuitry connected between a first input node, a second input node, a first output node, and a second output node, the differential clock duty cycle adjuster circuitry comprising: a first PMOS transistor with a gate terminal connected to the first input node, a source terminal connected to a first current source, and a drain terminal connected to the second output node; a second PMOS transistor with a gate terminal connected to the second input node, a source terminal connected to the first current source, and a drain terminal connected to the first output node; a first NMOS transistor with a gate terminal connected to the first input node, a drain terminal connected to the first current source, and a source terminal connected to the first output node; and a second NMOS transistor with a gate terminal connected to the second input node, a drain terminal connected to the first current source, and a source terminal connected to the second output node.

In a second aspect, the subject matter described in this specification can be embodied in an apparatus that includes a differential clock duty cycle adjuster circuitry connected between a first input node, a second input node, a first output node, and a second output node, the differential clock duty cycle adjuster circuitry comprising: a first PMOS transistor with a gate terminal connected to the first input node, a drain terminal connected to a first current sink, and a source terminal connected to the first output node; a second PMOS transistor with a gate terminal connected to the second input node, a drain terminal connected to the first current sink, and a source terminal connected to the second output node; a first NMOS transistor with a gate terminal connected to the first input node, a source terminal connected to the first current sink, and a drain terminal connected to the second output node; and a second NMOS transistor with a gate terminal connected to the second input node, a source terminal connected to the first current sink, and a drain terminal connected to the first output node.

In a third aspect, the subject matter described in this specification can be embodied in a method that includes converting an input rail-to-rail differential clock signal to a low-swing differential signal; fixing a DC bias level of the low-swing differential signal; changing DC bias levels of ends of the low-swing differential signal in a complementary manner to change cross-over points of the low-swing differential signal; and inputting the low-swing differential signal to a level shifter and buffer to generate a duty-corrected rail-to-rail digital differential clock signal.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures.

What is claimed is:

1. An apparatus comprising:
a differential clock duty cycle adjuster circuitry connected between a first input node, a second input node, a first output node, and a second output node, the differential clock duty cycle adjuster circuitry comprising:
a first PMOS transistor with a gate terminal connected to the first input node, a source terminal connected to a first current source, and a drain terminal connected to the second output node;
a second PMOS transistor with a gate terminal connected to the second input node, a source terminal connected to the first current source, and a drain terminal connected to the first output node;
a first NMOS transistor with a gate terminal connected to the first input node, a drain terminal connected to the first current source, and a source terminal connected to the first output node; and
a second NMOS transistor with a gate terminal connected to the second input node, a drain terminal connected to the first current source, and a source terminal connected to the second output node.

2. The apparatus of claim 1, wherein the differential clock duty cycle adjuster circuitry comprises:
a third PMOS transistor with a gate terminal connected to a first differential control signal node, a source terminal connected to a second current source, and a drain terminal connected to the second output node; and
a fourth PMOS transistor with a gate terminal connected to a second differential control signal node, a source terminal connected to the second current source, and a drain terminal connected to the first output node.

3. The apparatus of claim 2, wherein the differential clock duty cycle adjuster circuitry comprises:
a third current source connected to the first output node; and
a fourth current source connected to the second output node.

4. The apparatus of claim 3, wherein the third current source includes a PMOS transistor with a gate terminal connected to a bias voltage node and the fourth current source includes a PMOS transistor with a gate terminal connected to the bias voltage node.

5. The apparatus of claim 3, wherein the third current source includes a PMOS transistor with a gate terminal coupled to a first bias control pin and the fourth current source includes a PMOS transistor with a gate terminal connected to a second bias control pin to enable independent bias control of voltages at the first output node and the second output node.

6. The apparatus of claim 1, wherein a rail-to-rail digital differential clock signal is applied to the first input node and the second input node and a low-swing analog differential clock signal is generated at the first output node and the second output node.

7. The apparatus of claim 6, comprising:
a level shifter and buffer with input nodes connected to the first output node and the second output node, wherein the low-swing analog differential clock signal at the first output node and the second output node is input to the level shifter and buffer to generate a duty-corrected rail-to-rail digital differential clock signal.

8. The apparatus of claim 1, wherein the first current source includes a PMOS transistor with a gate terminal connected to a bias voltage node.

9. An apparatus comprising:
a differential clock duty cycle adjuster circuitry connected between a first input node, a second input node, a first output node, and a second output node, the differential clock duty cycle adjuster circuitry comprising:
a first PMOS transistor with a gate terminal connected to the first input node, a drain terminal connected to a first current sink, and a source terminal connected to the first output node;
a second PMOS transistor with a gate terminal connected to the second input node, a drain terminal connected to the first current sink, and a source terminal connected to the second output node;
a first NMOS transistor with a gate terminal connected to the first input node, a source terminal connected to the first current sink, and a drain terminal connected to the second output node; and
a second NMOS transistor with a gate terminal connected to the second input node, a source terminal connected to the first current sink, and a drain terminal connected to the first output node.

10. The apparatus of claim 9, wherein the differential clock duty cycle adjuster circuitry comprises:
a third NMOS transistor with a gate terminal connected to a first differential control signal node, a source terminal connected to a second current sink, and a drain terminal connected to the second output node; and
a fourth NMOS transistor with a gate terminal connected to a second differential control signal node, a source terminal connected to the second current sink, and a drain terminal connected to the first output node.

11. The apparatus of claim 10, wherein the differential clock duty cycle adjuster circuitry comprises:
a third current sink connected to the first output node; and
a fourth current sink connected to the second output node.

12. The apparatus of claim 11, wherein the third current sink includes a NMOS transistor with a gate terminal connected to a bias voltage node and the fourth current sink includes a NMOS transistor with a gate terminal connected to the bias voltage node.

13. The apparatus of claim 11, wherein the third current sink includes a NMOS transistor with a gate terminal coupled to a first bias control pin and the fourth current sink includes a NMOS transistor with a gate terminal connected to a second bias control pin to enable independent bias control of voltages at the first output node and the second output node.

14. The apparatus of claim 9, wherein a rail-to-rail digital differential clock signal is applied to the first input node and the second input node and a low-swing analog differential clock signal is generated at the first output node and the second output node.

15. The apparatus of claim 14, comprising:
a level shifter and buffer with input nodes connected to the first output node and the second output node, wherein the low-swing analog differential clock signal at the first output node and the second output node is input to the level shifter and buffer to generate a duty-corrected rail-to-rail digital differential clock signal.

16. The apparatus of claim 9, wherein the first current sink includes a NMOS transistor with a gate terminal connected to a bias voltage node.

17. A method comprising:
converting an input rail-to-rail differential clock signal to a low-swing differential signal;
fixing a DC bias level of the low-swing differential signal;
changing DC bias levels of ends of the low-swing differential signal in a complementary manner to change cross-over points of the low-swing differential signal; and
inputting the low-swing differential signal to a level shifter and buffer to generate a duty-corrected rail-to-rail digital differential clock signal.

18. The method of claim 17, wherein the input rail-to-rail differential clock signal has a duty cycle between 60 percent and 70 percent, and the duty-corrected rail-to-rail digital differential clock signal has a duty cycle between 48 percent and 52 percent.

19. The method of claim 17, wherein the DC bias levels of the low-swing differential signal are controlled independently of duty cycle correction of the input rail-to-rail differential clock signal.

20. The method of claim 17, further comprising:
driving voltages on a first bias control pin and a second bias control pin to independently control DC bias levels of voltages at a first output node and a second output node that bear the low-swing differential signal.

* * * * *